(12) United States Patent
Jeon et al.

(10) Patent No.: US 12,352,808 B2
(45) Date of Patent: Jul. 8, 2025

(54) SUBSTRATE INSPECTION APPARATUS AND SUBSTRATE INSPECTION METHOD

(71) Applicant: SAMSUNG ELECTRONICS CO., LTD., Suwon-si (KR)

(72) Inventors: Sekye Jeon, Suwon-si (KR); Jinwoo Lee, Suwon-si (KR); Jongcheon Sun, Suwon-si (KR); Suyoung Lee, Suwon-si (KR); Hyeongcheol Lee, Suwon-si (KR); Chungsam Jun, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 219 days.

(21) Appl. No.: 18/203,138

(22) Filed: May 30, 2023

(65) Prior Publication Data

US 2024/0175915 A1 May 30, 2024

(30) Foreign Application Priority Data

Nov. 23, 2022 (KR) .......................... 10-2022-0158017

(51) Int. Cl.
*G01R 31/28* (2006.01)
*G01R 27/02* (2006.01)
*G01R 27/26* (2006.01)

(52) U.S. Cl.
CPC ....... *G01R 31/2853* (2013.01); *G01R 31/287* (2013.01); *G01R 27/02* (2013.01); *G01R 27/2605* (2013.01)

(58) Field of Classification Search
CPC ........ G01R 27/00; G01R 27/02; G01R 27/26; G01R 27/2605; G01R 27/2617;
(Continued)

(56) References Cited

U.S. PATENT DOCUMENTS 5,239,270 A * 8/1993 Desbiens ........... G01R 31/2648
324/719
6,137,303 A * 10/2000 Deckert ............. G01R 31/2831
414/757

(Continued)

FOREIGN PATENT DOCUMENTS

CN     102456667 B  *  4/2014   ............. H01L 22/32
EP     0546731 A1   *  6/1993   ....... H01L 23/49575
(Continued)

*Primary Examiner* — Hoai-An D. Nguyen
(74) *Attorney, Agent, or Firm* — Fish & Richardson P.C.

(57) ABSTRACT

In a substrate inspection method, a substrate is provided on a substrate stage, the substrate having internal wires and connection wires, the internal wires respectively provided between stacked insulating layers, the connection wires respectively extending from the internal wires and exposed to an upper surface of the substrate. An electric circuit of the internal wires in the substrate is modeled to generate a circuit model. AC power is applied to the substrate stage to obtain measured capacitance values of the internal wires through currents that are obtained from the connection wires. DC power is applied to the substrate stage to obtain measured resistance values of the internal wires through voltages that are obtained from the connection wires. Impedance values of the internal wires are calculated through the measured capacitance values and the measured resistance values. The impedance values and the circuit model are compared to determine reliability of the substrate.

20 Claims, 10 Drawing Sheets

(58) Field of Classification Search
CPC .... G01R 31/00; G01R 31/28; G01R 31/2851;
G01R 31/2853; G01R 31/2855; G01R
31/286; G01R 31/287
USPC .......................... 324/500, 512, 519, 525, 555
See application file for complete search history.

(56) References Cited

U.S. PATENT DOCUMENTS

| | | |
|---|---|---|
| 6,774,692 B2 | 8/2004 | Kim et al. |
| 6,930,502 B2 | 8/2005 | Lee et al. |
| 6,975,129 B2 | 12/2005 | Chang |
| 7,078,896 B2 | 7/2006 | Bonnell et al. |
| 7,093,509 B2 | 8/2006 | Shao et al. |
| 7,193,424 B2 | 3/2007 | Chang |
| 7,958,776 B2 | 6/2011 | Wang |
| 9,213,047 B2 | 12/2015 | Li et al. |
| 10,197,595 B2 | 2/2019 | Su |
| 11,067,620 B2 * | 7/2021 | Lee .................... G01R 31/2621 |
| 2003/0057988 A1 | 3/2003 | Maeda et al. |
| 2004/0108847 A1 * | 6/2004 | Stoll .................. G01R 31/2887 324/757.01 |
| 2010/0295560 A1 | 11/2010 | Tran |
| 2016/0187377 A1 * | 6/2016 | McCloud ........... G01R 1/06705 324/750.19 |
| 2017/0010321 A1 * | 1/2017 | Wang ................ G01R 31/2853 |

FOREIGN PATENT DOCUMENTS

| | | | |
|---|---|---|---|
| JP | 20000021945 A | 1/2000 | |
| KR | 458363 A | 2/2003 | |
| KR | 102410310 B1 * | 6/2022 | ............. G01R 31/28 |

\* cited by examiner

SUBSTRATE INSPECTION APPARATUS AND SUBSTRATE INSPECTION METHOD

CROSS-REFERENCE TO RELATED APPLICATION

This application claims priority under 35 U.S.C. § 119 to Korean Patent Application No. 10-2022-0158017, filed on Nov. 23, 2022, in the Korean Intellectual Property Office (KIPO), the contents of which are herein incorporated by reference in their entirety.

BACKGROUND

1. Field

Example embodiments relate to a substrate inspection apparatus and a substrate inspection method. More particularly, example embodiments relate to a substrate inspection apparatus and a substrate inspection method of determining reliability of a semiconductor substrate by calculating impedance values from an electric circuit of the semiconductor substrate.

2. Description of the Related Art

V-NAND flash memory may be structured to have highly stacked layers to maximize chip capacity. As the number of the stacked layers constituting the memory increases, a structure of the V-NAND flash memory becomes more complex and various defects may occur. For example, the defects may occur when two or more word lines are electrically connected to each other. The defects may not be detected in an FAB-in process but may be detected in a FAB-out process. Time and cost may be consumed in the fab-out process to perform inspections to detect the defects.

SUMMARY

Example embodiments provide a substrate inspection method that may reduce time and cost consumed in defect detection by comparing measured impedance values with a circuit model in a semiconductor substrate.

Example embodiments provide a substrate inspection apparatus capable of performing the substrate inspection method.

According to example embodiments, in a substrate inspection method, a substrate is provided on a substrate stage, the substrate having a plurality of internal wires and a plurality of connection wires, the plurality of internal wires respectively provided between a plurality of insulating layers stacked on one another, and the plurality of connection wires respectively extending from the plurality of the internal wires and exposed to an upper surface of the substrate. An electric circuit of the internal wires in the substrate is modeled to generate a circuit model. AC power is applied to the substrate stage to obtain measured capacitance values of the internal wires through currents that are obtained from the connection wires. DC power is applied to the substrate stage to obtain measured resistance values of the internal wires through voltages that are obtained from the connection wires. Impedance values of the internal wires are calculated through the measured capacitance values and the measured resistance values. The impedance values and the circuit model are compared to determine reliability of the substrate.

According to example embodiments, in a substrate inspection method, a substrate is provided on a substrate stage, the substrate having a plurality of internal wires and a plurality of connection wires, the plurality of internal wires respectively provided between a plurality of insulating layers stacked on one another, and the plurality of connection wires respectively extending from the plurality of the internal wires and exposed to an upper surface of the substrate. An electric circuit having capacitance values of the internal wires is modeled to generate a circuit model. AC power is applied to the substrate stage to obtain measured capacitance values of the internal wires through currents that are obtained from the connection wires. DC power is applied to the substrate stage to obtain measured resistance values of the internal wires through voltages that are obtained from the connection wires. Impedance values of the internal wires are calculated through the measured capacitance values and the measured resistance values. Reliability of the impedance values is determined through the circuit model.

According to example embodiments, in a substrate inspection method, a substrate is provided on a substrate stage, the substrate having a plurality of internal wires, a plurality of connection wires and a through channel, the plurality of internal wires respectively provided between a plurality of insulating layers stacked on one another, the plurality of connection wires respectively extending from the plurality of the internal wires and exposed to an upper surface of the substrate, and a through channel penetrating at least a portion of the insulating layers. An electric circuit of the internal wires in the substrate is modeled to generate a circuit model. AC power is applied to the substrate stage to obtain measured capacitance values of the internal wires through currents that are obtained from the connection wires. DC power is applied to the substrate stage to obtain measured resistance values of the internal wires through voltages that are obtained from the connection wires. Impedance values of the internal wires are calculated through the measured capacitance values and the measured resistance values. The impedance values and the circuit model are compared to determine reliability of the substrate. Modeling an electric circuit includes, calculating a basic capacitance value between the internal wires provided adjacent to each other, calculating first theoretical capacitance values of the internal wires according to a height, and calculating second theoretical capacitance values between the through channel and the internal wires.

According to example embodiments, in a substrate inspection method, a substrate may be provided on a substrate stage, the substrate may have a plurality of internal wires and a plurality of connection wires, the plurality of internal wires may be respectively provided between a plurality of insulating layers stacked on one another, and the plurality of connection wires may be respectively extending from the plurality of the internal wires and exposed to an upper surface of the substrate. An electric circuit of the internal wires in the substrate may be modeled to generate a circuit model. AC power may be applied to the substrate stage to obtain measured capacitance values of the internal wires through currents that are obtained from the connection wires. DC power may be applied to the substrate stage to obtain measured resistance values of the internal wires through voltages that are obtained from the connection wires. Impedance values of the internal wires may be calculated through the measured capacitance values and the measured resistance values. The impedance values and the circuit model may be compared to determine reliability of the substrate.

Thus, the substrate inspection method may determine the reliability of the substrate on which patterns are formed. The AC power may be applied to the substrate stage to obtain quantitative capacitance values of the internal wires, and the DC power may be applied to the substrate stage to obtain quantitative resistance values of the internal wires. The impedance values may be calculated through the capacitance values and the resistance values. The method might not calculate the impedance values at a local area of the upper surface of the substrate, but a series structure or a parallel structure may be inspected in a lower film quality of the substrate.

Also, the reliability of the substrate may be determined through the circuit model that is modeled from the electric circuits. When a problem occurs in only a portion of the internal wires in the substrate, the problem may affect the calculated impedance values. The reliability of the entire substrate may be determined by calculating the impedance values of only some portion of the internal wires.

BRIEF DESCRIPTION OF THE DRAWINGS

Example embodiments will be more clearly understood from the following detailed description taken in conjunction with the accompanying drawings. FIGS. 1 to 10 represent non-limiting, example embodiments as described herein.

DETAILED DESCRIPTION OF EXAMPLE EMBODIMENTS

Hereinafter, example embodiments will be explained in detail with reference to the accompanying drawings.

Figure 1:
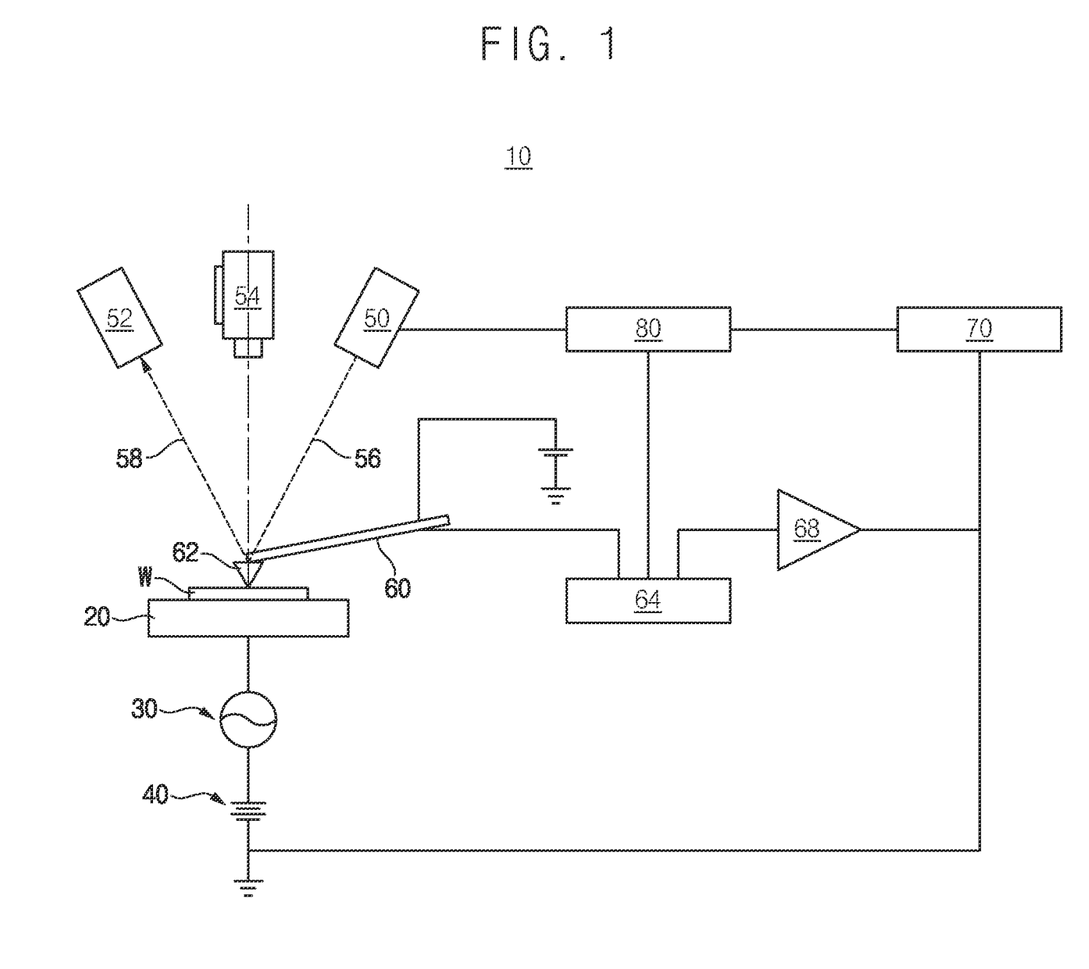
FIG. 1 is a view illustrating a substrate inspection apparatus in accordance with example embodiments.

FIG. 1 is a view illustrating a substrate inspection apparatus in accordance with example embodiments.

Referring to FIG. 1, a substrate inspection apparatus 10 may include a substrate stage 20 having a seating surface capable of placing a semiconductor substrate 100, an AC power source 30 configured to supply alternating current (AC) power to the semiconductor substrate 100 through the substrate stage 20, a DC power source 40 configured to supply direct current (DC) power to the semiconductor substrate 100, an atomic force microscope configured to obtain a topographical image of the semiconductor substrate 100, and an electrical scanning sensor configured to obtain an electrical image of the semiconductor substrate 100. For example, the substrate inspection apparatus 10 may inspect the semiconductor substrate 100 through scanning probe microscopy (SPM) technology.

In example embodiments, the atomic force microscope may obtain the topographical image having a surface image of the semiconductor substrate 100 through long-wavelength light. The atomic force microscope may include a light generator 50 configured to generate the long-wavelength light, a photodetector 52 configured to acquire light reflected from the semiconductor substrate 100, and a compensator 54 configured to correct a position of the light irradiated onto the semiconductor substrate 100.

The atomic force microscope may obtain a 3D structure of an upper surface of the semiconductor substrate 100. The atomic force microscope may inspect surface roughness of the upper surface through the 3D structure.

In example embodiments, the electrical scanning sensor may obtain a 2D electrical image from an electrical circuit in the semiconductor substrate 100. The electrical scanning sensor may include a cantilever 60 and a conductive probe 62 provided at an end of the cantilever 60. The electrical scanning sensor may include a capacitance sensor. The electrical scanning sensor may obtain two-dimensional differential capacitance images.

One side of the cantilever 60 may be fixed, and other side opposite to the one side of the cantilever 60 may not be fixed. The cantilever 60 may generate deformation by receiving a bending moment. The cantilever 60 may move the conductive probe 62 in a vertical direction through the deformation.

The conductive probe 62 may directly contact the semiconductor substrate 100 to obtain an electronic signal. The electrical image may be obtained from the electronic signal. The electronic signal may have an oscillation frequency. The conductive probe 62 may be provided on the other side of the cantilever 60. The conductive probe 62 may oscillate in the vertical direction through the unfixed other side. The conductive probe 62 may move away from or approach to a surface of the semiconductor substrate 100 through vibration movement.

The electric sensor 64 may be electrically connected to the conductive probe 62 to receive the electronic signal. The electrical sensor 64 may obtain capacitance values between the conductive probe 62 and the semiconductor substrate 100. The electrical sensor 64 may modulate capacitance signals obtained from conductive probe 62 into measurable form. For example, the electrical sensor 64 may include an ultra-high frequency capacitance sensor, a spreading resistance sensor, or a current sensor.

An amplifier 68 may demodulate the capacitance signals from the oscillation frequency that is obtained from the conductive probe 62. The amplifier 68 may generate a signal corresponding to a modulation amplitude between the conductive probe 62 and the semiconductor substrate 100.

The light generator 50 may be disposed on the cantilever 60. The light generator 50 may emit light 56 capable of acquiring the topographical image of the semiconductor substrate 100. The light generator 50 may radiate the light 56 onto the conductive probe 62 of the electrical scanning sensor. The light 56 irradiated from the light generator 50 may be reflected from an upper surface of the conductive probe 62. For example, the light generator 50 may include a laser diode.

The photodetector 52 may receive light 58 reflected from the conductive probe 62. As the cantilever 60 is bent, a position of the reflected light 58 irradiated onto the photodetector 52 may be changed. A photodetector 52 may measure a change in the position of the reflected light 58. The photodetector 52 may obtain the topographical image having the surface image of the semiconductor substrate 100 through the change of the position.

The compensator 54 may correct the position of the light 56 that is irradiated from the light generator 50. The compensator 54 may be provided above the cantilever 60. The compensator 54 may capture a focus of the light 56 that is irradiated from the light generator 50. The compensator 54 may control a focal position of the light 56 such that the light 56 irradiated from the light generator 50 is reflected from an upper surface of the cantilever 60. The compensator 54 may control the focal position of the light 56 through a feedback circuit 80.

The controller 70 may receive the signal from the amplifier 68 and may transfer the signal to the feedback circuit 80. The feedback circuit 80 may store information of the semiconductor substrate 100 as 3D space data. The 3D space data may have an X coordinate, a Y coordinate, and a Z coordinate of the upper surface of the semiconductor substrate 100. The 3D space data may be transferred to a display device capable of displaying an image of sample capacitance or terrain.

For example, the substrate inspection apparatus 10 may include a conductive atomic force microscope, a scanning microwave impedance microscope, a scanning diffusion resistance microscope, a kelvin force microscope microscopy.

Figure 2:
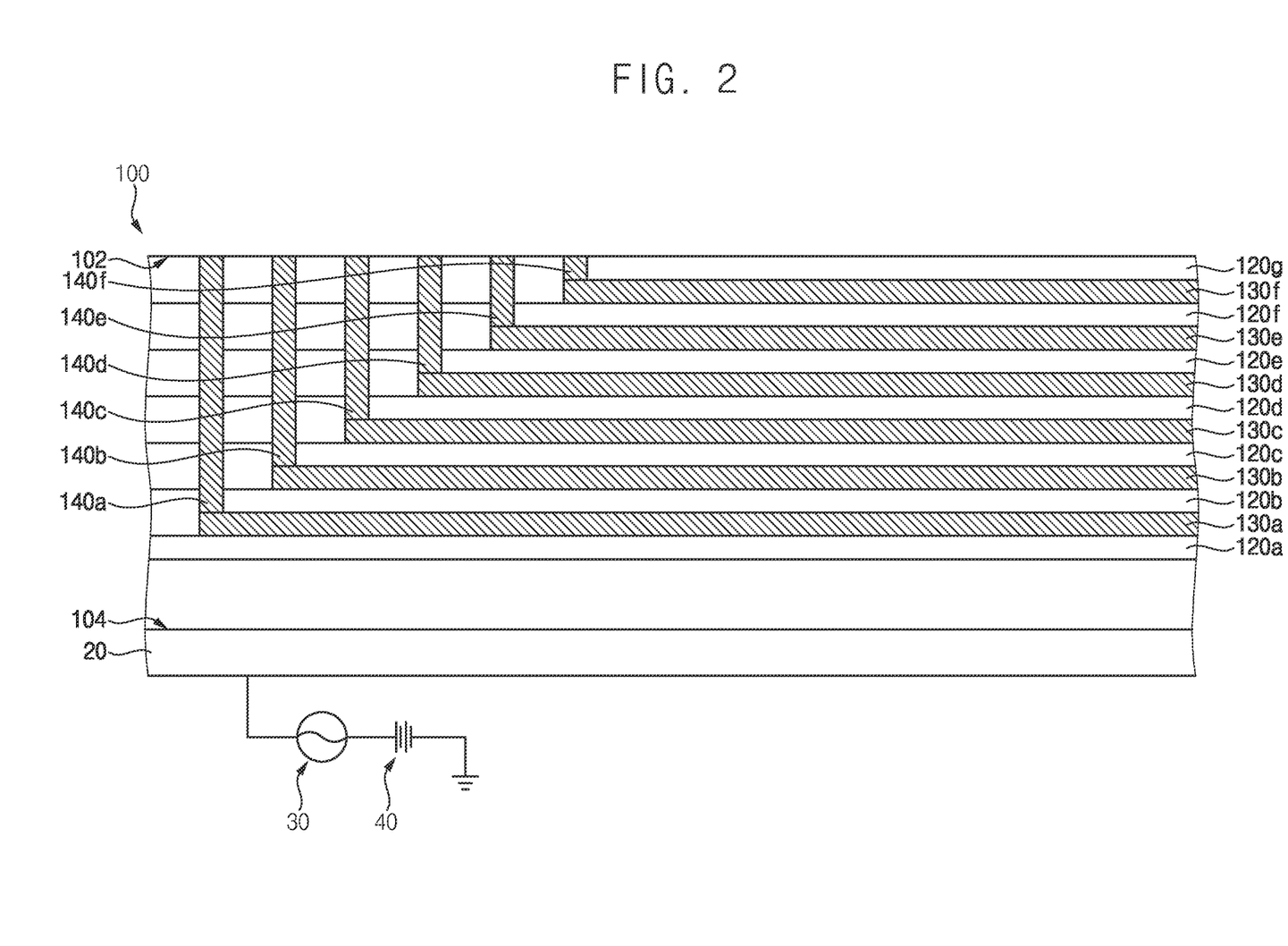
FIG. 2 is a view illustrating a substrate provided on a substrate stage.

FIG. 2 is a view illustrating a substrate provided on a substrate stage.

Referring to FIG. 2, the semiconductor substrate 100 may have the upper surface 102 and a lower surface 104 opposite to the upper surface. The semiconductor substrate 100 may include a silicon substrate 110, a plurality of insulating layers 120 stacked on one another on the silicon substrate 110, a plurality of internal wires 130 respectively provided between the insulating layers 120, and a plurality of connection wires 140 respectively extending from the internal wires to penetrate the insulating layers 120 in the vertical direction and exposed from the upper surface.

The semiconductor substrate 100 may include integrated circuit chips that are completed by performing semiconductor manufacturing processes, respectively. The integrated circuit chip may include a memory chip or a logic chip. The semiconductor substrate 100 may include a nonvolatile memory device that has a cell on peripheral circuit (COP). The memory device may include a V-NAND flash memory.

The silicon substrate 110 may have circuit patterns on one surface. The circuit patterns may include transistors, diodes, and the like. The circuit patterns may constitute circuit elements. Thus, the silicon substrate 110 may be a semiconductor device that has a plurality of the circuit elements provided therein.

For example, the silicon substrate 110 may include a semiconductor material such as silicon, germanium, and silicon-germanium. The silicon substrate 110 may include a III-V compound semiconductor such as gallium phosphide (GaP), gallium arsenide (GaAs), and gallium antimonide (GaSb). The silicon substrate 110 may include a poly-silicon substrate, a silicon-on-insulator (SOI) substrate, and a germanium-on-insulator (GOI) substrate.

The semiconductor substrate 100 may be disposed on the substrate stage 20 such that the silicon substrate 110 faces the substrate stage 20. When the semiconductor substrate 100 is arranged on the substrate stage 20, the circuit patterns in the silicon substrate 110 of the semiconductor substrate 100 may be electrically connected to each other and the silicon substrate 110 may have an equal potential based on the internal wires 130 and the connection wires 140.

In example embodiments, the insulating layers 120 may include the first to seventh insulating layers 120a, 120b, 120c, 120d, 120e, 120f, and 120g stacked in the vertical direction. The internal wires 130 may include first to sixth internal wires 130a, 130b, 130c, 130d, 130e, and 130f provided in the first to seventh insulating layers 120. The connection wires 140 may include first to sixth connection wires 140a, 140b, 140c, 140d, 140e and 140f that respectively extend from the internal wires 130 to penetrate the insulating layers 120 in the vertical direction.

The insulating layers may include a polymer or a dielectric layer. The insulating layers may be formed by a vapor deposition process, a spin coating process, or the like. The internal wires may be formed by a plating process, an electroless plating process, a vapor deposition process, or the like.

In example embodiments, the insulating layers 120 may cover the internal wires 130. The first insulating layer (lowermost insulating layer) 120a may be provided on an upper surface of the silicon substrate 110, and the seventh insulating layer (uppermost insulating layer) 120g may be provided on the upper surface 102 of the semiconductor substrate 100.

Particularly, the first internal wire 130a may be provided on the first insulating layer 120a. The first connection wire 140a may extend from the first internal wire 130a to penetrate the insulating layers 120 in the vertical direction. One end of the first connection wire 140a may contact the first internal wire 130a, and the other end opposite to the one end of the first connection wire 140a may be exposed from the seventh insulating layer 120g.

The second internal wire 130b may be provided on the second insulating layer 120b. The second connection wire 140b may extend from the second internal wire 130b to penetrate at least a portion of the insulating layers 120 in the vertical direction.

The third internal wire 130c may be provided on the third insulating layer 120c. The third connection wire 140c may extend from the third internal wire 130c to penetrate at least a portion of the insulating layers 120 in the vertical direction.

The fourth internal wire 130d may be provided on the fourth insulating layer 120d. The fourth connection wire 140d may extend from the fourth internal wire 130d to penetrate at least a portion of the insulating layers 120 in the vertical direction.

The fifth internal wire 130e may be provided on the fifth insulating layer 120e. The fifth connection wire 140e may extend from the fifth internal wire 130e to penetrate at least a portion of the insulating layers 120 in the vertical direction.

The sixth internal wire 130f may be provided on the sixth insulating layer 120f. The sixth connection wire 140f may extend from the sixth internal wire 130f to penetrate at least a portion of the insulating layers 120 in the vertical direction. The seventh insulating layer 120g may cover the sixth internal wire 130f.

The internal wires 130 and the connection wires 140 may include a metal material. For example, the metal material may include nickel (Ni), antimony (Sb), bismuth (Bi), zinc (Zn), indium (In), palladium (Pd), platinum (Pt), aluminum (Al), copper (Cu), molybdenum (Mo), titanium (Ti), gold (Au), silver (Ag), chromium (Cr), tin (Sn), or alloys thereof.

Hereinafter, a method of substrate inspection using the substrate inspection apparatus will be described.

Figure 3:
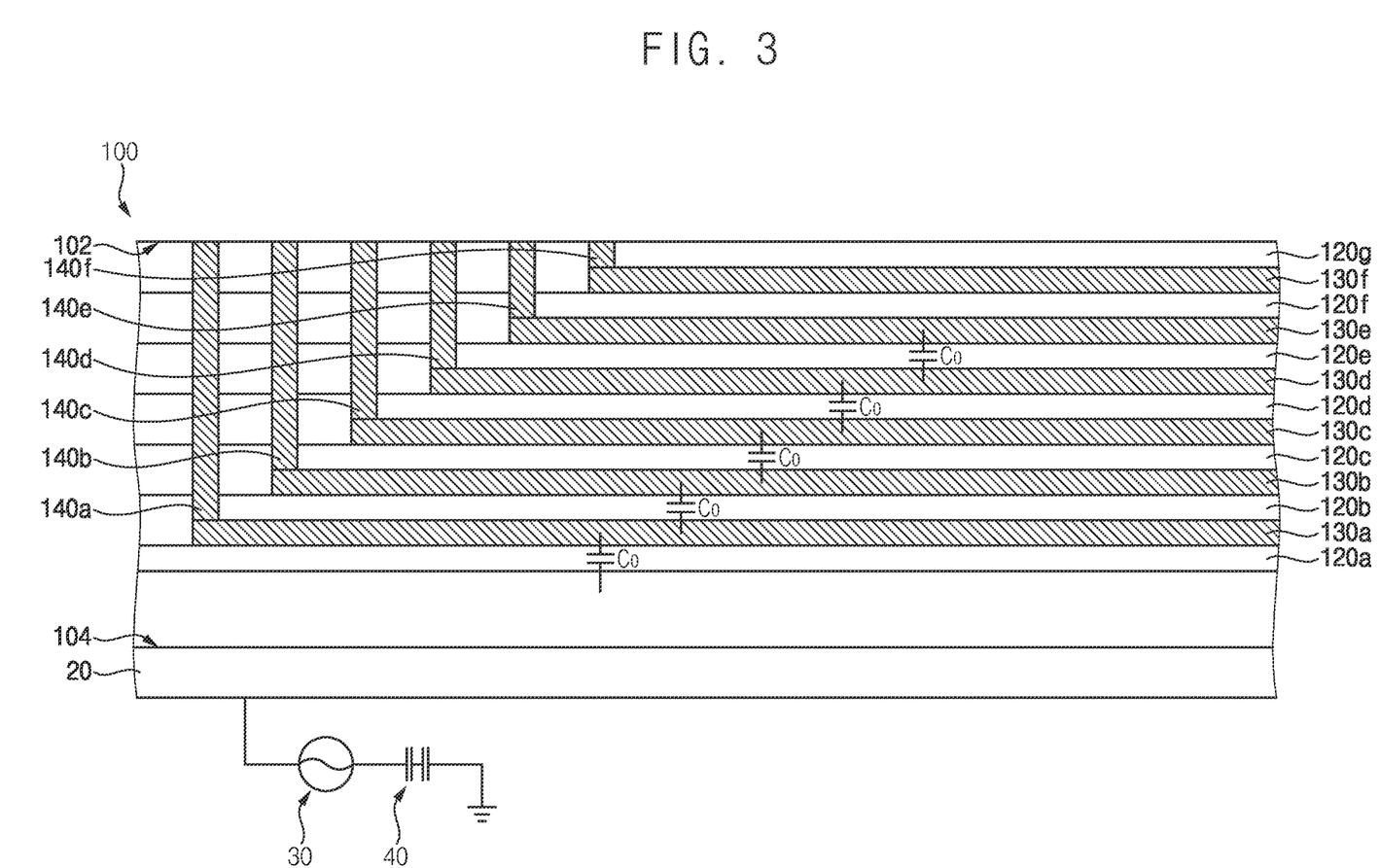
FIGS. 3 and 4 are views illustrating a process of modeling an electric circuit in a substrate to generate a circuit model.
Figure 4:
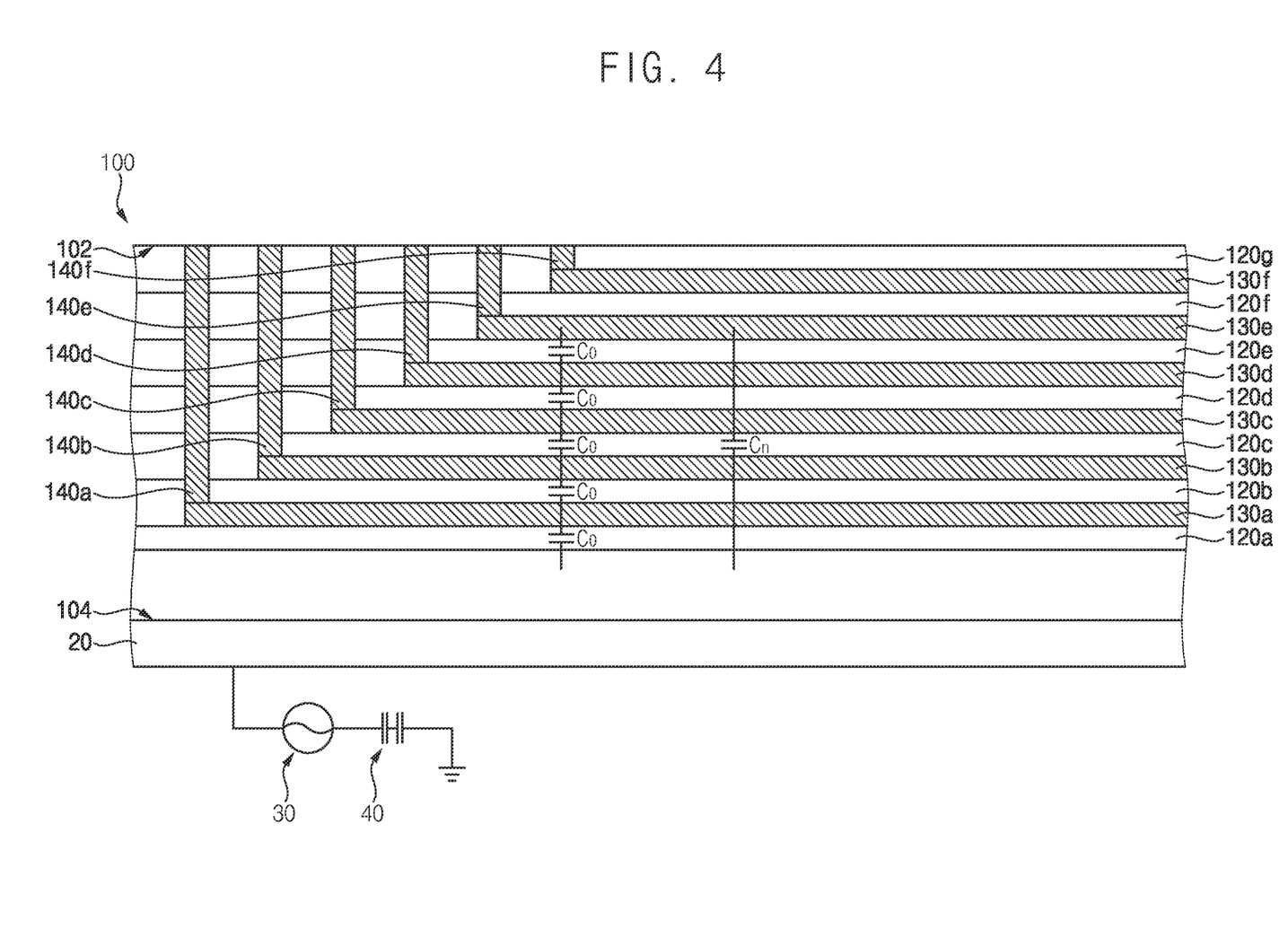
Figure 5:
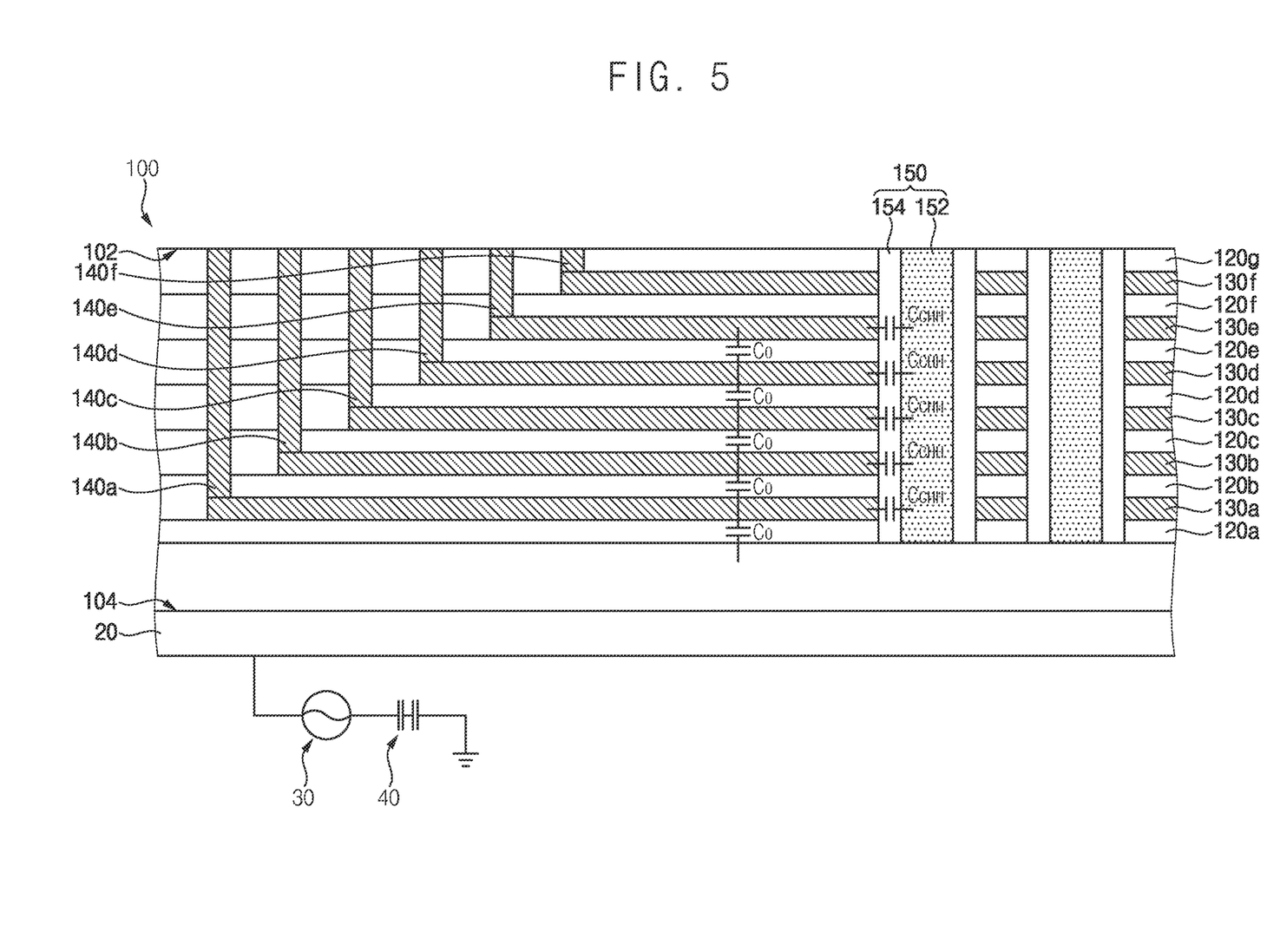
FIGS. 5 to 7 are views illustrating a process of modeling an electric circuit in a substrate having a through channel to generate a circuit model.
Figure 6:
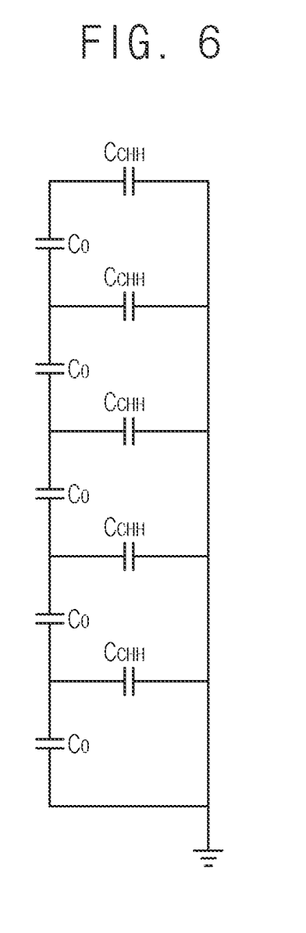
Figure 7:
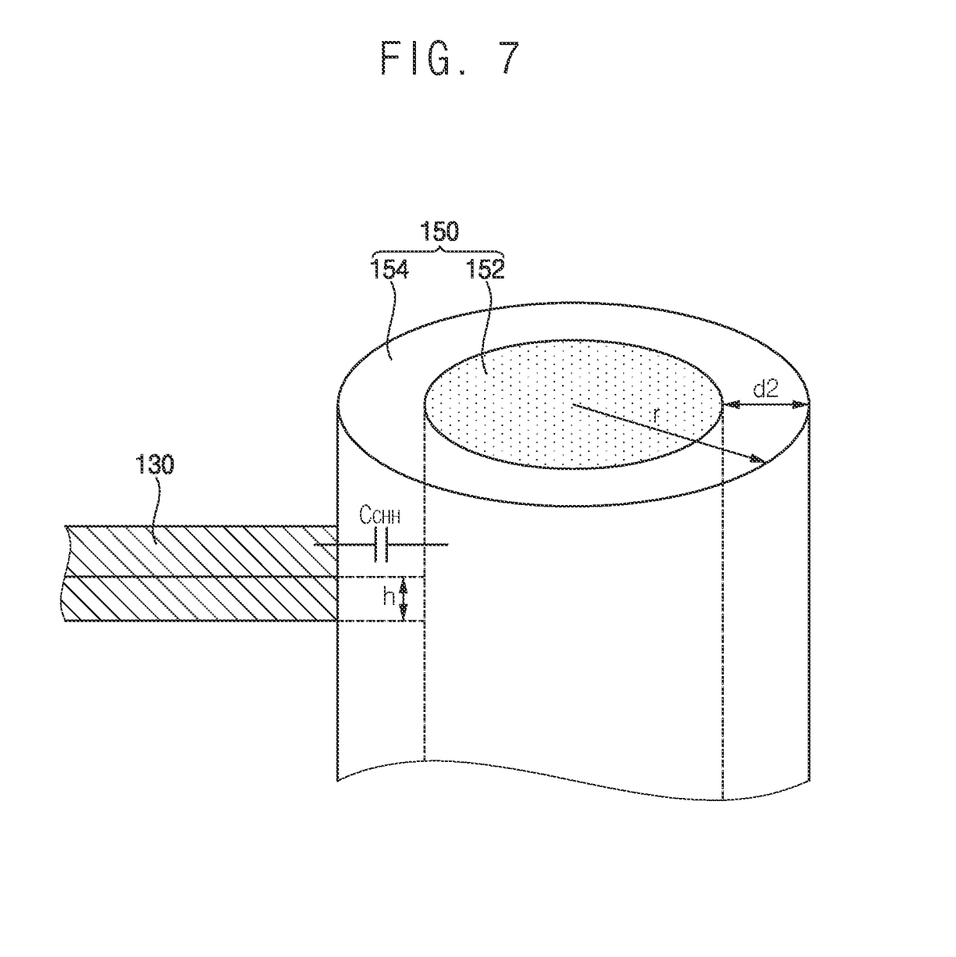
Figure 8:
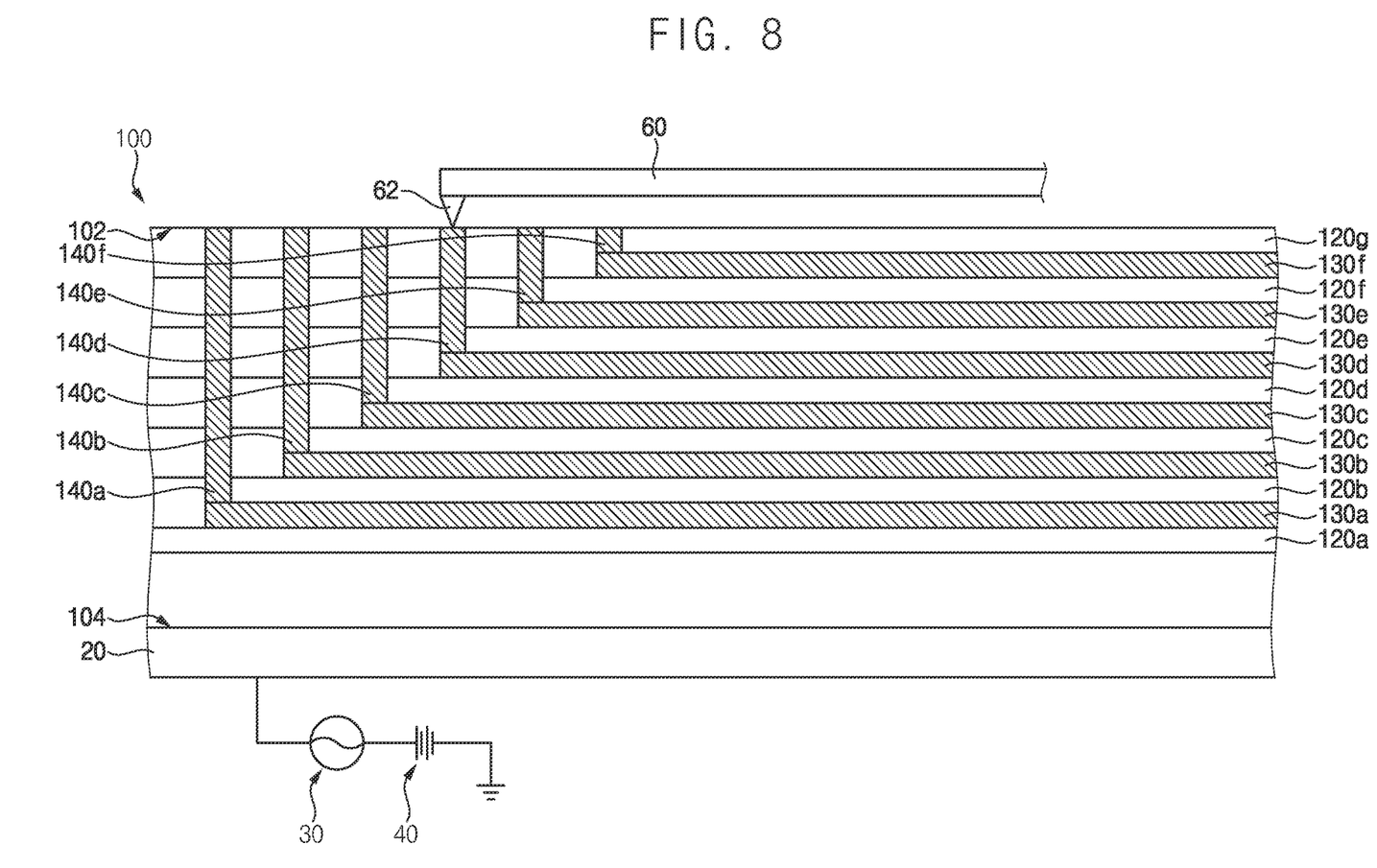
FIGS. 8 and 9 are views illustrating a process of inspecting a substrate through a tip of a cantilever.
Figure 9:
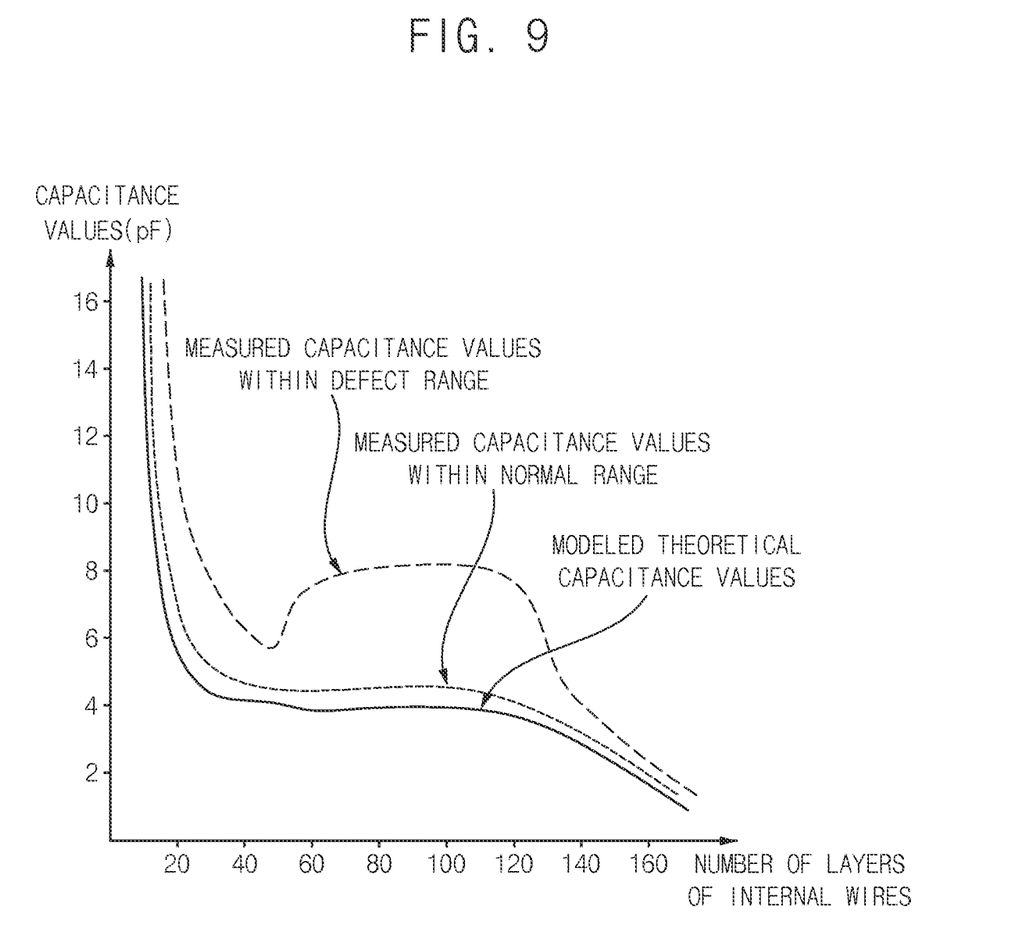
Figure 10:
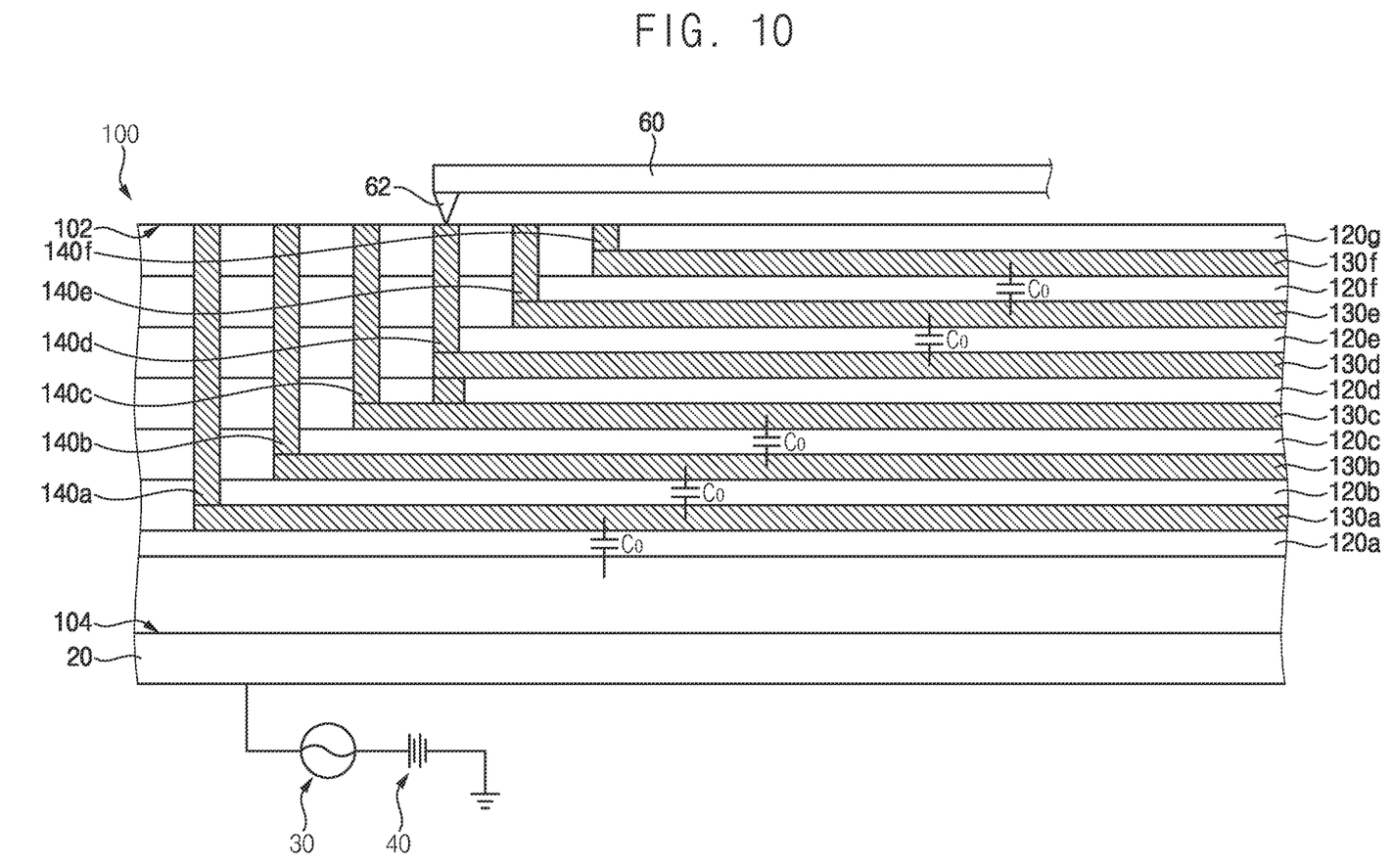
FIG. 10 is a view illustrating a process of inspecting a substrate having defects.

FIGS. 3 and 4 are views illustrating a process of modeling an electric circuit in a substrate to generate a circuit model. FIGS. 5 to 7 are views illustrating a process of modeling an electric circuit in a substrate having a through channel to generate a circuit model. FIGS. 8 and 9 are views illustrating a process of inspecting a substrate through a tip of a cantilever. FIG. 10 is a view illustrating a process of inspecting a substrate having defects.

Referring to FIGS. 1 to 10, first, a semiconductor substrate 100 may be arranged on a substrate stage 20. The substrate stage 20 may receive alternating current (AC) power from an AC power source 30, and the substrate stage 20 may receive direct current (DC) power from a DC power source 40.

Then, as illustrated in FIGS. 3 and 4, an electric circuit of internal wires 130 in the semiconductor substrate 100 may be modeled to generate a circuit model.

In example embodiments, a basic capacitance value may be calculated between the internal wires 130 provided adjacent to each other to model the electric circuit. The basic capacitance value may be a theoretical capacitance value generated when the AC power is applied between adjacent internal wires 130.

Assumption conditions may be created to model the electric circuit. An assumption condition may be assumed that circuit patterns in a silicon substrate 110 are in equal potential with respect to the internal wires 130. An assumption condition may be assumed that areas of the internal wires 130 adjacent to each other are the same. An assumption condition may be assumed that lengths of the internal wires 130 adjacent to each other are the same.

The basic capacitance value between the internal wires 130 adjacent to each other may be defined by following Equation (1).

$$C_0 = \epsilon_1 \frac{A}{d_1} \quad \text{Equation (1)}$$

(Here, $\epsilon_1$ is a first permittivity of the insulating layer, $d_1$ is a thickness of the insulating layer, and A is an area of the internal wires).

In example embodiments, a first theoretical capacitance value of the internal wire 130 provided in an n layer may be calculated to model the electric circuit. A capacitance value of the internal wires 130 provided in the n layer may be the same as basic capacitances of the stacked internal wires 130 that are connected in series with each other. The first theoretical capacitance value may be a theoretical capacitance value generated when the AC power is applied to the internal wires 130 provided in the n layer.

The first theoretical capacitance value of the internal wire 130 provided in the n layer may be defined by following Equation (2).

$$C_n = \frac{C_0}{n} \quad \text{Equation (2)}$$

(Here, $C_0$ is the basic capacitance value, and n is the number of layers of the internal wires).

For example, the first theoretical capacitance value of the fifth internal wire 130e may be same as a capacitance value of the basic capacitances connected in series, and the basic capacitance may be generated between the first to fifth internal wires 130a, 130b, 130c, 130d, and 130e, respectively.

Then, as illustrated in FIGS. 5 to 7, electrical circuits of a through channel 150 and the internal wires 130 in the semiconductor substrate 100 may be modeled to generate the circuit model.

In example embodiments, the semiconductor substrate 100 may further include at least one through channel 150 that penetrates at least a portion of the plurality of insulating layers 120 stacked on one another in the vertical direction. The through channel 150 may include a conductive structure 152 and an insulating structure 154 covering an outer surface of the conductive structure.

Second theoretical capacitance values may be calculated between the conductive structure 152 and each of the internal wires 130 to model the electric circuit. When the AC power is applied to the conductive structure 152 and the internal wire 130, the second theoretical capacitance value may be derived between the conductive structure 152 insulated by the insulating structure 154 and the internal wire 130. The second theoretical capacitance value may be a theoretical capacitance value generated when the AC power is applied to the conductive structure 152 and the internal wire 130.

The second theoretical capacitance value may be defined by following Equation (3).

$$C_{CHH} = \frac{2\pi\epsilon_2 h}{\ln(1 + \frac{r}{r - d_2})} \quad \text{Equation (3)}$$

(Here, $\epsilon_2$ is a second permittivity of the insulating structure, h is a height of the internal wire, r is a radius of the through channel, and $d_2$ is a second thickness of the insulating structure).

For example, a capacitance value of the fifth internal wire 130e may be calculated using the basic capacitance values and the second theoretical capacitance values. The basic capacitance values may be obtained between the first to fifth internal wires 130a, 130b, 130c, 130d, and 130e, respectively. The second theoretical capacitance values may be obtained between the first to fifth internal wires 130a, 130b, 130c, 130d, and 130e and the conductive structure 152, respectively.

As illustrated in FIG. 8, a conductive probe 62 electrically connected to a cantilever 60 may contact an upper surface 102 of the semiconductor substrate 100 to perform scanning. The substrate stage 20 on which the semiconductor substrate 100 is arranged may receive the AC power and the DC power, respectively. Alternatively, the substrate stage 20 may be simultaneously supplied with the AC power and the DC power.

Then, the conductive probe 62 may scan the connection wires 140 that are exposed from the upper surface 102 of the semiconductor substrate 100. The conductive probe 62, the cantilever 60, the internal wire 130, the connection wire 140, and the substrate stage 20 may form one closed circuit. For example, measured capacitance values and measured resistance values of each of the internal wires 130 may be obtained through a conductive atomic force microscopy.

When the AC power is applied to the substrate stage 20, the conductive probe 62 may obtain current values that flow through the connection wires 140, respectively. The conductive probe 62 may obtain the measured capacitance values of the internal wires 130 through the current values of the connection wires 140. The measured capacitance values may be experimental capacitance values that are obtained through a substrate inspection apparatus 10.

The measured capacitance value may be defined by following Equation (4).

$$C = \frac{i}{2\pi f V} \quad \text{Equation (4)}$$

(Here, i is the obtained current values, f is a frequency of the AC power, and V is a voltage of the AC power).

For example, the measured capacitance value of the fifth internal wire 130e may be obtained by contacting the conductive probe 62 with a one end of the fifth connection wire 140e. The measured capacitance value of the fifth internal wire 130e may be obtained through the current values obtained through the conductive probe 62. The frequency and the voltage of the AC power may be determined by the AC power source.

The basic capacitance values may be obtained between the first to fifth internal wires 130a, 130b, 130c, 130d, and 130e, respectively. The second theoretical capacitance values may be obtained between the first to fifth internal wires 130a, 130b, 130c, 130d, and 130e and the conductive structure 152, respectively.

When the DC power is applied to the substrate stage 20, the conductive probe 62 may obtain voltage values of connection wires 140. The conductive probe 62 may obtain the measured resistance values of the internal wires 130 through the voltage values of the connection wires 140. The measured resistance values may be experimental resistance values that are obtained through the substrate inspection apparatus 10.

Then, impedance values of the internal wires 130 may be calculated through the measured capacitance values and the measured resistance values. The impedance values may be experimental impedance values that are obtained through the substrate inspection apparatus 10.

Then, the impedance values and the circuit model may be compared to determine reliability of the semiconductor substrate 100.

As illustrated in FIG. 9, the conductive probe 62 may obtain the measured capacitance values from the connection wires 140. The circuit model may calculate different theoretical capacitance values of the first and second capacitances from the connection wires 140. When the measured capacitance values are within a normal range from the modeled first and second theoretical capacitance values, the substrate inspection apparatus 10 may determine that the semiconductor substrate 100 is normal. When the measured capacitance values are within a defect range from the modeled first and second theoretical capacitance values, the substrate inspection apparatus 10 may determine that the semiconductor substrate 100 is defective.

As illustrated in FIG. 10, a bridge may occur between the third internal wire 130c and the fourth internal wire 130d. When the bridging occurs, the measured capacitance values of the third internal wire 130c and the fourth internal wire 130d may be obtained as the same. The conductive probe 62 may scan the third connection wire 140c and the fourth connection wire 140d to determine the bridge that is generated between the third internal wire 130c and the fourth internal wire 130d.

As described above, the method may determine the reliability of the substrate 100 on which patterns are formed. The AC power may be applied to the substrate stage 20 to obtain quantitative capacitance values of the internal wires 130, and the DC power may be applied to the substrate stage 20 to obtain quantitative resistance values of the internal wires 130. The impedance values may be calculated through the capacitance values and the resistance values. The method might not calculate the impedance values at a local area of the upper surface of the substrate 100, a series structure or a parallel structure may be inspected in a lower film quality of the substrate 100.

Also, the reliability of the substrate 100 may be determined through the circuit model that is modeled from the electric circuits. When a problem occurs in only a portion of the internal wires 130 in the substrate 100, the problem may affect the calculated impedance values. The reliability of the entire substrate 100 may be determined by calculating the impedance values of only some portion of the internal wires 130.

As is traditional in the field, embodiments may be described and illustrated in terms of blocks which carry out a described function or functions. These blocks, which may be referred to herein as units or modules or the like, are physically implemented by analog and/or digital circuits such as logic gates, integrated circuits, microprocessors, microcontrollers, memory circuits, passive electronic components, active electronic components, optical components, hardwired circuits and the like, and may optionally be driven by firmware and/or software. The circuits may, for example, be embodied in one or more semiconductor chips, or on substrate supports such as printed circuit boards and the like. The circuits constituting a block may be implemented by dedicated hardware, or by a processor (e.g., one or more programmed microprocessors and associated circuitry), or by a combination of dedicated hardware to perform some functions of the block and a processor to perform other functions of the block. Each block of the embodiments may be physically separated into two or more interacting and discrete blocks without departing from the scope of the disclosure. Likewise, the blocks of the embodiments may be physically combined into more complex blocks without departing from the scope of the disclosure. An aspect of an embodiment may be achieved through instructions stored within a non-transitory storage medium and executed by a processor.

The foregoing is illustrative of example embodiments and is not to be construed as limiting thereof. Although a few example embodiments have been described, those skilled in the art will readily appreciate that many modifications are possible in example embodiments without materially departing from the novel teachings and advantages of the present invention. Accordingly, all such modifications are intended to be included within the scope of example embodiments as defined in the claims.

What is claimed is:

1. A substrate inspection method, the method comprising:
   providing a substrate on a substrate stage, the substrate having a plurality of internal wires and a plurality of connection wires, the plurality of internal wires respectively provided between a plurality of insulating layers stacked on one another, the plurality of connection wires respectively extending from the plurality of the internal wires and exposed to an upper surface of the substrate;
   modeling an electric circuit of the plurality of internal wires in the substrate to generate a circuit model;
   applying AC power to the substrate stage to obtain measured capacitance values of the plurality of internal wires through currents that are obtained from the connection wires;
   applying DC power to the substrate stage to obtain measured resistance values of the plurality of internal wires through voltages that are obtained from the connection wires;
   calculating impedance values of the plurality of internal wires through the measured capacitance values and the measured resistance values; and comparing the impedance values and the circuit model to determine reliability of the substrate.

2. The method of claim 1, wherein modeling the electric circuit includes:
calculating basic capacitance values between internal wires that are provided adjacent to each other, wherein:
each basic capacitance value is defined by Equation 1:

$$C_0 = \epsilon_1 \frac{A}{d_1}, \qquad \text{[Equation 1]}$$

$\epsilon_1$ is a first permittivity of a respective insulating layer,
$d_1$ is a thickness of the respective insulating layer, and
A is an area of an internal wire.

3. The method of claim 2, wherein modeling the electric circuit includes:
calculating first theoretical capacitance values of the plurality of internal wires according to heights, wherein:
each first theoretical capacitance value is defined by Equation 2:

$$C_n = \frac{C_0}{n}, \qquad \text{[Equation 2]}$$

$C_0$ is the basic capacitance value, and
n is the number of layers between the substrate and a respective one of the plurality of internal wires.

4. The method of claim 1, wherein modeling the electric circuit includes assuming that other circuit patterns provided outside the plurality of insulating layers in the substrate are equal potential with each other.

5. The method of claim 1, wherein the substrate includes a through channel that has a conductive structure penetrating at least a portion of the plurality of insulating layers and an insulating structure covering an outer surface of the conductive structure.

6. The method of claim 5, wherein modeling the electric circuit further includes:
calculating second theoretical capacitance values between the conductive structure and each of the plurality of internal wires, wherein:
each second theoretical capacitance value is defined by Equation 3:

$$C_{CHH} = \frac{2\pi\epsilon_2 h}{\ln(1 + \frac{r}{r - d_2})}, \qquad \text{[Equation 3]}$$

$\epsilon 2$ is a second permittivity of the insulating structure,
h is a height of a respective internal wire,
r is a radius of the through channel, and
d2 is a second thickness of the insulating structure.

7. The method of claim 1, wherein applying the AC power to the substrate stage to obtain the measured capacitance values of the plurality of internal wires includes:
obtaining the measured capacitance values through Equation 4:

$$C = \frac{i}{2\pi f V}, \qquad \text{[Equation 4]}$$

wherein:
i is an obtained current,
f is a frequency of the AC power, and
V is a voltage of the AC power.

8. The method of claim 1, wherein comparing the impedance values and the circuit model to determine the reliability of the substrate includes determining that the substrate has a defect in which a bridge occurs between the plurality of internal wires having the same capacitance values, when the same capacitance values are measured among the measured capacitance values of each of the plurality of internal wires.

9. The method of claim 1, wherein the substrate includes a V-NAND flash memory.

10. The method of claim 1, wherein applying the AC power to the substrate stage to obtain the measured capacitance values and applying the DC power to the substrate stage to obtain the measured resistance values include obtaining the measured capacitance values and the measured resistance values through conductive atomic force microscopy.

11. A substrate inspection method, the method comprising:
providing a substrate on a substrate stage, the substrate having a plurality of internal wires and a plurality of connection wires, the plurality of internal wires respectively provided between a plurality of insulating layers stacked on one another, the plurality of connection wires respectively extending from the plurality of the internal wires and exposed to an upper surface of the substrate;
modeling an electric circuit having capacitance values of the plurality of internal wires to generate a circuit model;
applying AC power to the substrate stage to obtain measured capacitance values of the plurality of internal wires through currents that are obtained from the connection wires;
applying DC power to the substrate stage to obtain measured resistance values of the plurality of internal wires through voltages that are obtained from the connection wires;
calculating impedance values of the plurality of internal wires through the measured capacitance values and the measured resistance values; and
determining reliability of the impedance values through the circuit model.

12. The method of claim 11, wherein modeling the electric circuit includes:
calculating basic capacitance values between the plurality of internal wires that are provided adjacent to each other, wherein:
each basic capacitance value is defined by Equation 1:

$$C_0 = \epsilon_1 \frac{A}{d_1}, \qquad \text{[Equation 1]}$$

$\epsilon_1$ is a first permittivity of a respective insulating layer,
d1 is a thickness of the respective insulating layer, and
A is an area of an internal wire.

13. The method of claim 12, wherein modeling the electric circuit includes:
calculating first theoretical capacitance values of the plurality of internal wires according to heights, wherein:

each first theoretical capacitance value is defined by Equation 2:

$$C_n = \frac{C_0}{n},\qquad \text{[Equation 2]}$$

C0 is the basic capacitance value, and n is the number of layers between the substrate and a respective one of the plurality of internal wires.

14. The method of claim 11, wherein the substrate includes a through channel that has a conductive structure penetrating at least a portion of the plurality of insulating layers and an insulating structure covering an outer surface of the conductive structure.

15. The method of claim 14, wherein modeling the electric circuit further includes:
calculating second theoretical capacitance values between the conductive structure and each of the plurality of internal wires, wherein:
the second theoretical capacitance value is defined by Equation 3:

$$C_{CHH} = \frac{2\pi\epsilon_2 h}{\ln(1 + \frac{r}{r - d_2})},\qquad \text{[Equation 3]}$$

$\epsilon_2$ is a second permittivity of the insulating structure, h is a height of a respective internal wire, r is a radius of the through channel, and d2 is a second thickness of the insulating structure.

16. The method of claim 11, wherein applying the AC power to the substrate stage to obtain the measured capacitance values of the plurality of internal wires includes:
obtaining the measured capacitance values through Equation 4:

$$C = \frac{i}{2\pi f \mathrm{V}},\qquad \text{[Equation 4]}$$

i is an obtained current, f is a frequency of the AC power, and

V is a voltage of the AC power.

17. The method of claim 11, wherein determining the reliability of the impedance values includes determining that a bridge has occurred between the plurality of internal wires having the same capacitance values, when the same capacitance values are measured among the measured capacitance values of each of the plurality of internal wires.

18. The method of claim 11, wherein the substrate includes a V-NAND flash memory.

19. The method of claim 11, wherein applying the AC power to the substrate stage to obtain the measured capacitance values and applying the DC power to the substrate stage to obtain the measured resistance values include obtaining the measured capacitance values and the measured resistance values through conductive atomic force microscopy.

20. A method of substrate inspection, the method comprising:
providing a substrate on a substrate stage, the substrate having a plurality of internal wires, a plurality of connection wires and a through channel, the plurality of internal wires respectively provided between a plurality of insulating layers stacked on one another, the plurality of connection wires respectively extending from the plurality of the internal wires and exposed to an upper surface of the substrate, a through channel penetrating at least a portion of the plurality of insulating layers;
modeling an electric circuit of the plurality of internal wires in the substrate to generate a circuit model;
applying AC power to the substrate stage to obtain measured capacitance values of the plurality of internal wires through currents that are obtained from the connection wires;
applying DC power to the substrate stage to obtain measured resistance values of the plurality of internal wires through voltages that are obtained from the connection wires;
calculating impedance values of the plurality of internal wires through the measured capacitance values and the measured resistance values; and
comparing the impedance values and the circuit model to determine reliability of the substrate, wherein:
modeling an electric circuit includes:
calculating a basic capacitance value between the plurality of internal wires provided adjacent to each other;
calculating first theoretical capacitance values of the plurality of internal wires according to a height; and
calculating second theoretical capacitance values between the through channel and the plurality of internal wires.

\* \* \* \* \*